United States Patent [19]
Ranjan et al.

[11] Patent Number: 6,040,737
[45] Date of Patent: Mar. 21, 2000

[54] OUTPUT BUFFER CIRCUIT AND METHOD THAT COMPENSATE FOR OPERATING CONDITIONS AND MANUFACTURING PROCESSES

[75] Inventors: Nalini Ranjan, Sunnyvale; Henry Yang, San Jose, both of Calif.

[73] Assignee: S3 Incorporated, Santa Clara, Calif.

[21] Appl. No.: 09/005,077

[22] Filed: Jan. 9, 1998

[51] Int. Cl.[7] .................................................... G05F 1/10
[52] U.S. Cl. .......................... 327/543; 327/389; 327/538; 323/312
[58] Field of Search .............................. 327/87, 380, 381, 327/389, 538, 540, 541, 543; 323/312

[56] References Cited

U.S. PATENT DOCUMENTS

| | | | |
|---|---|---|---|
| 4,766,415 | 8/1988 | Dielacher | 323/312 |
| 5,001,482 | 3/1991 | Chung et al. | 341/136 |
| 5,155,385 | 10/1992 | Gotoh et al. | 307/296.8 |
| 5,668,550 | 9/1997 | Coleman, Jr. | 341/119 |
| 5,774,013 | 6/1998 | Groe | 327/543 |

Primary Examiner—Timothy P. Callahan
Assistant Examiner—Jung Ho Kim
Attorney, Agent, or Firm—Fenwick & West LLP

[57] ABSTRACT

The present invention provides improved output buffers for use on IC Chips. These output buffers incorporate a compensation circuit for compensating the performance characteristics of transistors included in the output buffers. The compensation circuit determines whether the output buffer is operating at a desired slew-rate. In response to this determination, the compensation circuit supplies a compensation voltage or voltages. The compensation voltages control a variable quantity of power delivered by a voltage controlled power source (VCPS). By increasing or reducing this power, the slew-rate of the output buffers are respectively increased or reduced. The compensation voltages maintain this slew-rate within narrow tolerances. This allows the improved output buffers of the present invention to meet very narrow input tolerances of circuitry coupled to receive signals from the IC Chip. The compensation circuit of the present invention is also beneficial for compensating various circuitry on an IC Chip, such as amplifier designs using constant current or power sources.

16 Claims, 5 Drawing Sheets

OUTPUT BUFFER CIRCUIT AND METHOD THAT COMPENSATE FOR OPERATING CONDITIONS AND MANUFACTURING PROCESSES

BACKGROUND OF THE INVENTION

1. Field of the Invention

The present invention relates generally to integrated circuitry that is compensated for process and operating condition variations. More particularly, the present invention relates to output buffers and amplifiers that are fabricated at least in part on an integrated circuit chip (IC Chip) and that are immune to process and operating condition variations encountered on the IC Chip.

2. Description of the Related Art

An IC Chip often is used to process signals from other circuitry. To communicate with such circuitry, the IC Chip includes a plurality of input buffers and output buffers. The input buffers allow the IC Chip to receive signals for processing without being damaged by voltage or power spikes in the signals. The received signals are then processed by the IC Chip, and in some instances an output signal is prepared for circuitry off the IC Chip The output buffers allow the IC Chip to supply such output signals with sufficient power, and protect the IC Chip from voltage and power spikes from other circuitry.

One type of conventional output buffer included on IC Chips comprises a pre-driver and an n-channel field effect transistor (NFET). The pre-driver has an input that receives a control signal from other circuitry on the IC Chip. The control signal indicates whether or not the output buffer will supply an output signal. The pre-driver also has an output that supplies a buffered control signal in response to the control signal received. This buffered control signal generally has greater signal strength than the control signal.

The NFET has a gate, source, and drain. The gate is coupled to the output of the pre-driver, and hence receives the buffered control signal. The source is coupled to a ground voltage supply. The ground voltage supply supplies electrical power to the NFET. The drain serves as an output port of the output buffer, and thus asserts output signals for circuitry off board the IC Chip.

In operation, the pre-driver turns ON the NFET to assert a LOW output signal at the drain. The low output signal is at the ground voltage level. To assert no output signal, the pre-driver turns OFF the NFET. Those skilled in the art will recognize that this conventional output buffer can be modified to assert HIGH output signals at a high voltage level, or to output signals both high and low output signals.

Conventional output buffers have several limitations. First, conventional output buffers of the same design often operate at different speeds due to variations in the manufacturing process used to fabricate the IC Chips. Second, transistors included in conventional output buffers usually operate more slowly as the IC Chip heats up. Because high speed IC Chips operate at very high temperatures, this limitation significantly reduces the rate at which signals can be output from such output buffers.

A third problem with conventional output buffers involves instability in the voltage level of output signals as the slew-rate of the output buffers is increased. The slew-rate of an output buffer (or transistor) is defined as the maximum rate of change in the voltage level of a signal output therefrom. For example, in an output buffer having a slew-rate of 0.3 Volts per nanosecond, approximately 10 nanoseconds are required to change the output signal from 0 Volts to 3 Volts.

The slew-rate can be increased to an extent to increase the speed of the output buffer. Unfortunately, as the slew-rate is increased in conventional output buffers, the value of the output signal can become unstable. At high slew-rates, the output signal will typically change to approximately the proper value quickly, and then return at least partially to its prior value. The value of the output signal often bounces back and forth until finally stabilizing around the proper value. Circuitry coupled to the output port of the output buffer will thus receive a bouncing output signal. Such circuitry often reads the wrong value from this output signal because it is bouncing. This problem with conventional output buffers prevents an IC Chip from communicating properly with other circuitry, which in turn leads to erroneous results.

The slew-rate of a conventional output buffer fabricated on an IC Chip is typically heavily dependent on variations in the manufacturing process used for fabricating the IC Chip, and on the particular operating conditions encountered in the IC Chip. To account for such variations, conventional output buffers typically are designed to operate well below an optimal slew-rate. Furthermore, the slew-rate typically will vary to a substantially degree during operation of the IC Chip. For example, as the IC Chip heats up, the slew-rate usually drops significantly. Consequently, it is very difficult to maintain the slew-rate of the conventional output buffer within the input tolerance of circuitry coupled to the output buffer.

There is thus a continuing need in the area of semiconductor electronics for an improved output buffer wherein both the speed and the slew-rate of the output buffer can be maintained within narrow tolerances. Such an improved output buffer preferably should not encounter the instability of conventional output buffers. Further, such an improved output buffer preferably should be immune to variations in performance despite any variations in the manufacturing process or operating conditions of the output buffer.

SUMMARY OF THE INVENTION

The present invention provides improved output buffers for use on IC Chips. These output buffers incorporate a compensation circuit for compensating the performance characteristics of transistors included in the output buffers. The compensation circuit determines whether the output buffer is operating at a desired slew-rate. In response to this determination, the compensation circuit controls the quantity of power available to an output port of the output buffer, which in turn controls the slew-rate of the output buffer.

One embodiment of an output buffer of the present invention comprises a first NFET, a compensation circuit, and a voltage controlled power source (VCPS). These component elements are interconnected and operate as follows.

The first NFET has a gate, source, and drain. The gate is coupled to a core of the IC Chip, the source is coupled to receive power from the VCPS, and the drain forms the output port of the output buffer. The core asserts a control signal to the gate. The control signal indicates whether or not the output buffer should assert an output signal. A HIGH control signal strongly turns ON the first NFET to assert a LOW output signal at the drain. A LOW control signal applied to the gate strongly turns OFF the first NFET to assert no output signal at the drain. As in the conventional output buffer, a pre-driver can be included between the core and the gate to buffer the control signal.

The slew-rate of the output buffer is given by the maximum rate of change of the drain voltage of the first NFET.

The slew-rate is related to the maximum rate that the drain of the first NFET draws current $I_{OUT}$ from circuitry coupled thereto. In particular, if this maximum rate of current is increased, then a capacitance at the drain of the first NFET will be discharged more quickly, and hence the drain voltage will decrease more quickly. This current is controlled by the compensation circuit and VCPS, which are described next.

The compensation circuit comprises an operational amplifier, a resistor, and a second NFET. A first input of the operational amplifier is coupled by the resistor to a high voltage source. A second input of the operational amplifier receives a fixed reference voltage. An output of the operational amplifier supplies the compensation voltage. The second NFET has a gate that is coupled to the output of the operational amplifier, a source that is coupled to an electrical ground, and a drain that is coupled to the first input of the operational amplifier. The compensation voltage is thus an amplification of the voltage difference between the reference voltage and the drain voltage of the second NFET.

The compensation voltage maintains a current flowing from the drain to the source in the second NFET at an equilibrium amplitude. In particular, a decrease in this current also decreases current flowing though the resistor. This increases the voltage difference between the inputs of the operational amplifier. Responsive thereto, the operational amplifier increases the compensation voltage, which more strongly turns ON the second NFET. This increases the current in the second NFET back toward equilibrium. Similarly, an increase in the current from equilibrium results in a decrease in the compensation voltage, and a corresponding decrease in the current back toward equilibrium. The compensation voltage controls the VCPS, which is described next.

The VCPS comprises a third NFET. The third NFET has a gate that is coupled to the output of the operational amplifier, a source that is coupled to an electrical ground, and a drain that is coupled to the source of the first NFET. The gate thus receives the compensation voltage. The compensation voltage controls the rate at which the third NFET supplies power to the first NFET. The drain of the third NFET supplies this power to the first NFET by drawing current from the source of the first NFET.

As those skilled in the art will recognize, the gates of the second and third NFETs are coupled together, and similarly, the sources of these two NFETs are coupled together. Moreover, both the second and third NFETs are fabricated on the same IC Chip, and are of similar designs. These similarities in electrical connections, fabrication, and design between the second and third NFETs allow the electrical characteristics of the second NFET to model those of the third NFET. The optimal degree of compensation for the second NFET is thus directly related to the optimal degree of compensation for the third NFET.

The compensation voltage stabilizes the rate that the VCPS supplies power to the first NFET when the first NFET is turned ON. This in turn stabilizes the slew-rate of the output buffer. For example, as the IC Chip heats up, the first NFET tends to operate more slowly, which tends to reduce the slew-rate of the output buffer. However, the increased heat causes the compensation circuit to increase the compensation voltage. The increased compensation voltage increases the rate that power is supplied by the VCPS to the first NFET. More particularly, the increased compensation voltage more strongly turns on the third NFET to increase the rate that the third NFET draws current from the first NFET. This in turn increases the current $I_{OUT}$, and hence increases the slew-rate of the output buffer back toward an equilibrium value, as desired.

There are various alternative embodiments of the present invention. Some such embodiments use other forms of VCPS. For example, a p-channel field effect transistor (PFET), or both an NFET and a PFET, can be included in the present invention. It is also possible to use other forms of transistor for fabricating the output buffer. For example, a tri-state output buffer comprising a pull-up PFET coupled drain to drain with a pull-down NFET can be used. The resistor and the reference voltage can be placed off the IC Chip. This allows for higher tolerances of resistance, and also allows adjustment of the resistance and reference voltage to account further for process variations in the IC Chip.

The present invention provides improved output buffers for use on IC Chips. These improved output buffers have very stable slew-rates. The slew-rate of the output buffer can maintained at an optimal level, or at any desired level below the optimal level, without encountering the instability encountered in conventional output buffers. Process variations in an IC Chip formed during fabrication thereof typically do not adversely impact the narrow tolerance in slew-rate provided by these output buffers. The improved output buffers also automatically adjust to changes in operating conditions, such as the operating temperature of the IC Chips.

More generally, the present invention provides a compensation circuit for compensating circuitry on an IC Chip for process and operating condition variations. For example, the compensation circuit can be coupled to supply power to an amplifier fabricated on the same IC Chip, and thus compensate the amplifier for such variations.

DETAILED DESCRIPTION OF THE INVENTION

Figure 1:
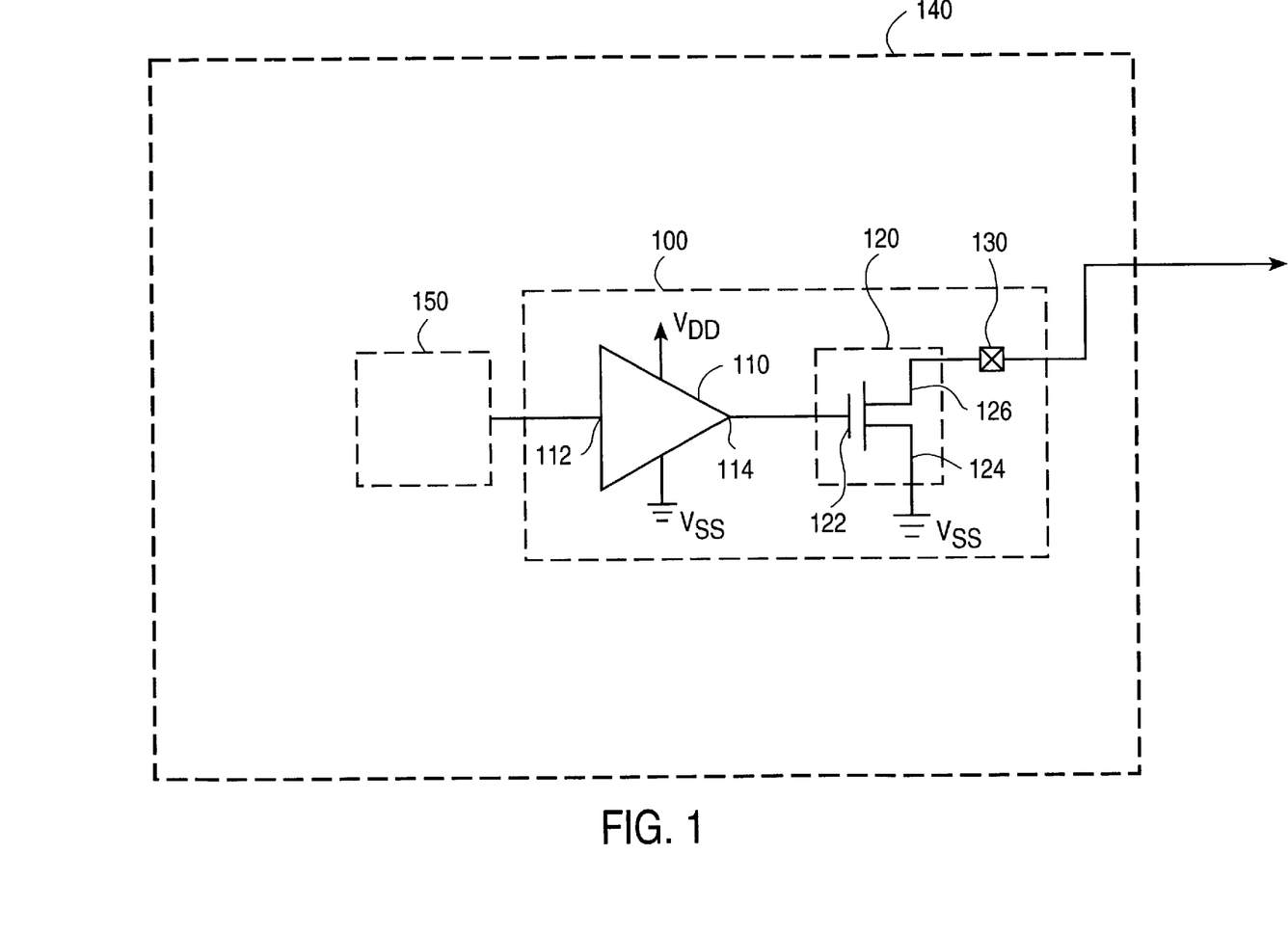
FIG. 1 is a block diagram of a conventional output buffer for use on an IC Chip.

Referring now to FIG. 1, there is shown a block diagram of a conventional output buffer 100 for use on an IC Chip 140. The conventional output buffer 100 comprises a predriver 110, an NFET 120, and a pad 130. All of these component elements 110, 120, 130 are fabricated on the IC Chip 140. The IC Chip 140 also includes a core 150 that processes information, and that controls the output buffer 100. The component elements 110, 120, 130 of the output buffer 100 operate in a voltage range between a ground voltage level $V_{SS}$ and a high voltage level $V_{DD}$, where $V_{SS}$ is lower than $V_{DD}$. As used herein, LOW specifies that a signal is asserted at $V_{SS}$, and HIGH specifies that a signal is asserted at $V_{DD}$.

The pre-driver 110 has an input port 112 and an output port 114. The input port 112 serves as an input port 112 of the conventional output buffer 100. The input port 112 receives a control signal from the core 150 of the IC Chip 140. This control signal determines whether or not the conventional output buffer 100 will supply an output signal. In response to this control signal, the output port 114 of the pre-driver 110 asserts a buffered control signal to the NFET 120. This buffered control signal generally has greater signal strength than the control signal.

The NFET 120 has a gate 122, source 124, and drain 126. The gate 122 is coupled to the output port 114 of the pre-driver 110, and hence receives the buffered control signal. The source 124 is coupled to the ground voltage at $V_{SS}$, which supplies electrical power to the NFET 120. The drain 126 serves as an output port 126 of the conventional output buffer 100, and thus supplies output signals to circuitry 160 off board the IC Chip 140.

The components elements 110, 120, 130 of the conventional output buffer 100 cooperate with the core 150 of the IC Chip 140 to assert an output signal. In particular, the core 150 determines whether or not the conventional output buffer 100 will assert an output signal on the pad 130. This core 150 generally cannot alone drive heavy loads. The purpose of the pre-driver 110 is to buffer the control signal for the core 150. The only output signal value that can be asserted by this output buffer is a LOW output signal at the $V_{SS}$. However, this conventional output buffer 100 can also assert no signal to the pad 130.

To assert the LOW output signal to the pad 130, the core 150 asserts a HIGH control signal to the input port 112 of the pre-driver 110. Responsive thereto, the output port 114 of the pre-driver 110 asserts a HIGH buffered control signal to the gate 124 of the NFET 120. The HIGH buffered control signal strongly turns ON the NFET 120. Consequently, the low voltage level $V_{SS}$ on the source 122 of the NFET 120 is received at the drain 126 of the NFET 120. This asserts the LOW output signal to the pad 130, as desired.

To assert no output signal to the pad 130, the core 150 supplies a LOW control signal to the input port 112 of the pre-driver 110. Responsive thereto, the output port 114 of the pre-driver 110 asserts a LOW buffered control signal to the gate 124 of the NFET 120. The LOW buffered control signal strongly turns OFF the NFET 120. Consequently, the low voltage level $V_{SS}$ on the source 122 of the NFET 120 is not received at the drain 126 of the NFET 120. This asserts no output signal to the pad 130, as desired.

The conventional output buffer 100 suffers from the various problems discussed above in the Background of the Related Art. It is very difficult to fabricate the pre-driver 110 and NFET 120 to be exactly the same from IC Chip to IC Chip. Consequently, this output buffer 100 can operate at different rates of speed on different IC Chips. This problem can also occur between a plurality of output buffers 100 on the same IC Chip, although usually to a lesser extent that between IC Chips. The NFET 120 typically operates more slowly as the IC Chip 140 heats up. Although the pre-driver 110 helps the core 150 to drive the NFET 120, it does not include any means for compensating the NFET 120 for process or operating condition variations. Thus, the conventional output buffer 100 typically has very wide speed and slew-rate tolerances, and must be operated well below an optimal slew-rate to avoid bouncing values in the output signal.

Figure 2:
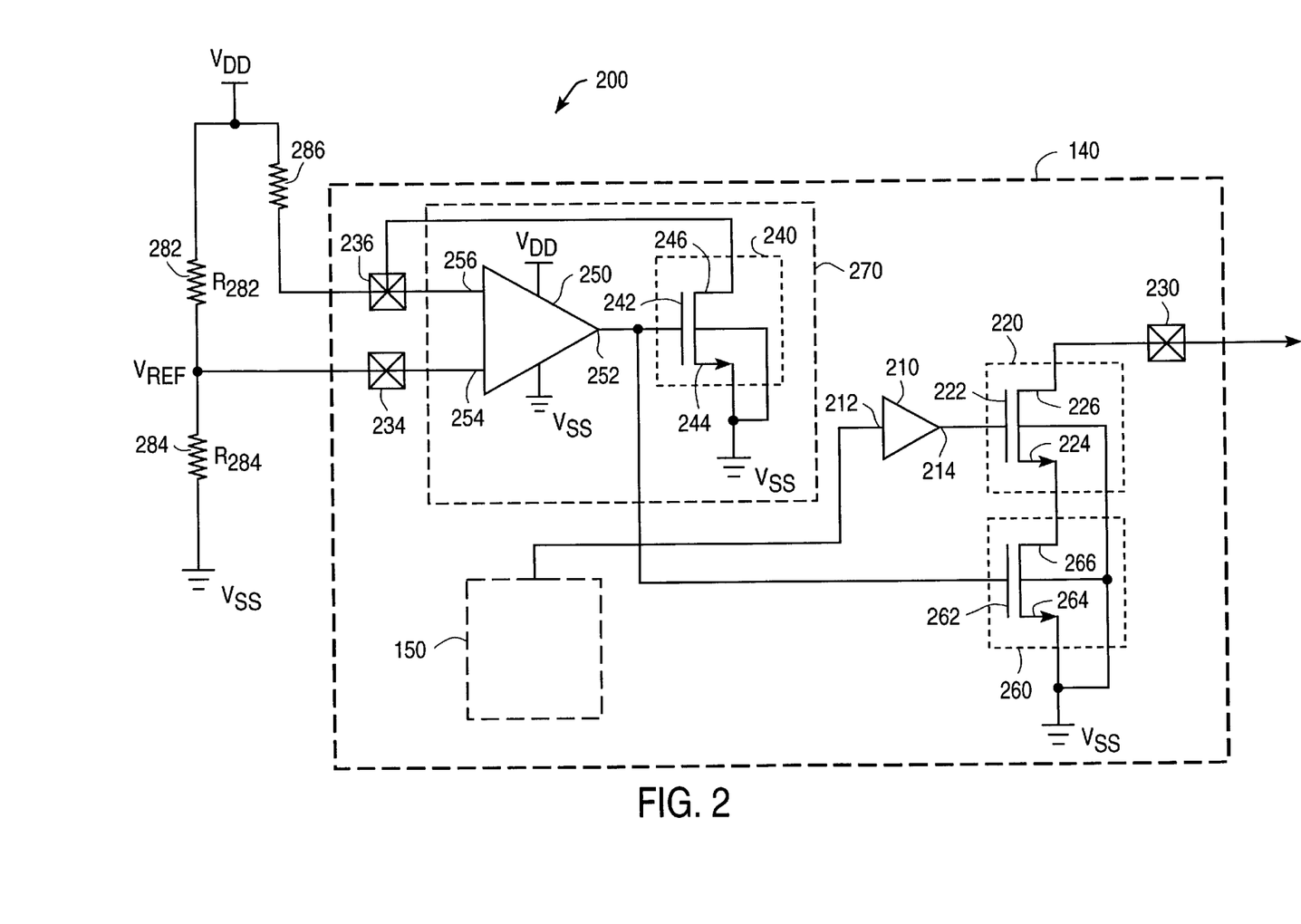
FIG. 2 is a block diagram of an improved output buffer of the present invention fabricated primarily on an IC Chip, but also including component elements fabricated off board the IC Chip.

Referring now to FIG. 2 there is shown a block diagram of a first embodiment of an improved output buffer 200 of the present invention. The improved output buffer 200 comprises a pre-driver 210, a compensation circuit 270, an NFET 220, a voltage controlled power source (VCPS) 260, and pads 230, 234, 236. These component elements are fabricated on an IC Chip 140. The improved output buffer 200 further comprises resistors 282, 284, 286 located off board the IC Chip 140.

The pre-driver 210, NFET 220, and pad 230 of the improved output buffer 200 are interconnected with the core 150 of the IC Chip 140, and with the VCPS 260, as follows. The pre-driver 210 has an input 212 and output 214. The input 212 of the pre-driver 210 is coupled the core 150 of the IC Chip 140, and receives a control signal therefrom. This control signal determines the output state of the improved output buffer 200. The output 214 of the pre-driver 210 supplies a buffered control signal to the NFET 220.

The NFET 220 has a gate 222, a source 224, and a drain 226. The gate 222 of the NFET 220 is coupled to the output 214 of the pre-driver 210, and thus receives the buffered control signal from the pre-driver 210. The source 224 of the NFET 220 is coupled to the VCPS 260, which supplies power to the NFET 220. Thus, unlike conventional output buffers, the source 224 is not coupled directly to the electrical ground $V_{SS}$. The drain 226 of the NFET 220 is coupled to the pad 230 which serves as an output port 230 of the improved output buffer 200.

To assert a LOW output signal to the pad 230, the core 150 asserts a HIGH control signal to the input 212 of the pre-driver 210. Responsive thereto, the output 214 of the pre-driver 210 asserts a HIGH buffered control signal to the gate 222 of the NFET 220, which causes the NFET 220 to assert the LOW output signal to the pad 230. To assert no output signal to the pad 230, the core 150 asserts a LOW control signal to the input 212 of the pre-driver 210. Responsive thereto, the output 214 of the pre-driver 210 asserts a LOW buffered control signal to the gate 222 of the NFET 220. The LOW buffered control signal turns OFF the NFET 220, and the NFET 220 thus asserts no signal to the pad 230.

The resistors 286, 282, 284, compensation circuit 270, and VCPS 260 cooperate to control the slew-rate of the improved output buffer 200. The resistors 282, 284, 286 assert voltages on the pads 234, 236. These voltages control the magnitude of a compensation voltage $V_{COMP}$ supplied by the compensation circuit 270. The compensation voltage $V_{COMP}$ controls the quantity of power supplied by the VCPS 260 to the source 224 of the NFET 220. The VCPS 260 supplies this power by drawing a current $I_{VCPS}$ from the source 224 of the NFET 220. The current $I_{VCPS}$ flows when the NFET 220 is turned ON, but is reduced to a negligible amplitude when the NFET 220 is turned OFF. The compensation voltage $V_{COMP}$ maintains the maximum amplitude of this current $I_{VCPS}$ at a substantially constant value. This maintains the slew-rate of the output buffer 200 within narrow tolerances.

The current $I_{VCPS}$ drawn from the NFET 220 flows from the pad 230, into the drain 226, out of the source 224, and into the VCPS 260. The amplitude of this current $I_{VCPS}$ is essentially equal to the total amplitude of current $I_{OUT}$ drawn from the pad 230 by the drain 226 of the NFET 220. To more succinctly describe the present invention, the distinction between $I_{VCPS}$ and $I_{OUT}$ is hereafter dropped. The maximum value of the current $I_{OUT}$ is directly proportional to the slew-rate of the improved output buffer 200. These various component elements and features of the present invention are next discussed in greater detail.

The resistors 282, 284 form a voltage divider. In particular, one end of the resistor 282 is coupled to the high voltage $V_{DD}$, one end of the resistor 284 is coupled to ground at $V_{SS}$, and the opposite ends of these resistors 282, 284 are coupled together to the pad 234.

The voltage divider formed by the resistors 282, 284 asserts a fixed reference voltage $V_{REF}$ to the pad 234. According to Ohm's Law, the magnitude of the reference voltage $V_{REF}$ is given by:

$$V_{REF}=(V_{SS} \cdot R_{282}+V_{DD} \cdot R_{284}) \div (R_{282}+R_{284});$$

where $R_{282}$ is the resistance of the resistor 282, and $R_{284}$ is the resistance of the resistor 284. The values of these resistances $R_{282}$ and $R_{284}$ are selected to provide an appropriate reference voltage $V_{REF}$, which depends in part on demands of circuitry that receives output signals from the improved output buffer 200.

The resistor 286 is coupled at one end to the high voltage $V_{DD}$, and coupled at the opposite end to the pad 236. This resistor 286 asserts a control voltage $V_{CNTL}$ to the pad 236. The magnitude of the control voltage $V_{CNTL}$ is a function of the magnitude of the high voltage $V_{DD}$, the resistance $R_{286}$ of the resistor 286, and the amplitude of current $I_{286}$ flowing through the resistor 286 and into the pad 236. This magnitude is given by:

$$V_{CNTL}=V_{DD}-(I_{286} \cdot R_{286});$$

where $I_{286} \cdot R_{286}$ is the voltage drop across the resistor 286 according to Ohm's Law.

The magnitude of $V_{DD}$ and the resistance $R_{286}$ of the resistor 286 typically are fixed prior to operation of improved output buffer 200. However, the amplitude of current $I_{286}$ flowing through the resistor 286 can vary due to process variations or variations in operating conditions of the improved output buffer 200. The compensation circuit 270 uses such variation in this current $I_{286}$ to model an optimal level of compensation for the output buffer 200.

In the improved output buffer 200, the resistors 282, 284, 286 are preferably fabricated off the IC Chip 140, as illustrated. This provides several benefits. First, it is typically difficult to implement fine tolerance resistors on an IC Chip. Fabricating these resistors 282, 284, 286 off the IC Chip 140 allows the resistances $R_{282}$, $R_{284}$, $R_{286}$ to be specified within very narrow tolerances, and thus allows the reference voltage $V_{REF}$ and control voltage $V_{CNTL}$ to be defined within very narrow tolerances. Second, the values of the resistances $R_{282}$, $R_{284}$, $R_{286}$ are independent of both temperature and process variations on the IC Chip 140. Third, the values of these resistances $R_{282}$, $R_{284}$, $R_{286}$ can be selected after the IC Chip 140 is fabricated. This allows these resistances $R_{282}$, $R_{284}$, $R_{286}$ to be selected to reflect process variations and variations in operating conditions on a particular IC Chip 140. However, it is also in accordance with the present invention to fabricate one or more of these resistors 282, 284, 286 on the IC Chip 140, for example by using a suitable length of doped polysilicon.

The compensation circuit 270 comprises an operational amplifier 250 and a second NFET 240. The operational amplifier has a first input 254 coupled to the pad 234, a second input 256 coupled to the pad 236, and an output 252 that supplies the compensation voltage $V_{COMP}$.

The second NFET 240 has a gate 242, source 244, and drain 246. The gate 242 is coupled to the output 252 of the operational amplifier 250, and hence to receives the compensation voltage $V_{COMP}$ therefrom. The source 244 is coupled to the electrical ground at $V_{SS}$. The drain 246 is coupled to the pad 236, and hence also to the second input 256 of the operational amplifier 250. The resistor 286 asserts the control voltage $V_{COMP}$ on all three 236, 246, 256. As is well understood in the art, the compensation voltage $V_{COMP}$ supplied by the operational amplifier 240 will be an amplification of the voltage difference between the fixed reference voltage $V_{REF}$ on the first input 254 of the operational amplifier 250 and the drain voltage $V_{CNTL}$ on the second input 256 of the operational amplifier 250.

The inputs 254, 256 of the operational amplifier 250 draw almost no current. Essentially all of the current $I_{286}$ flowing through the resistor 286 flows therefrom into the second NFET 240. This current $I_{286}$ enters the second NFET 240 at the drain 246, flows through a conductive channel from the drain 246 to the source 244, exits the source 244, and flows into the electrical ground at $V_{SS}$. As is well understood in the art, almost no current will flow into or out of the gate 242 of the second NFET 240. The current $I_{286}$ is thus essentially equal to the current $I_{NFET2}$ from the drain 246 to the source 244 in the second NFET 240.

The compensation voltage maintains the current $I_{NFET2}$ at an equilibrium level $I_{EQUI}$. In particular, a decrease in the current $I_{NFET2}$ from the equilibrium $I_{EQUI}$ results in decreased current $I_{286}$ in the resistor 286. Consequently, the drain voltage $V_{CNTL}$ increases according to Ohm's Law. This increases the voltage difference $V_{CNTL}-V_{REF}$ between the inputs 256, 254 of the operational amplifier 250. Responsive thereto, the operational amplifier 250 increases the compensation voltage $V_{COMP}$. The increase in the compensation voltage $V_{COMP}$ increases the gate voltage of the second NFET 240, which turns ON this NFET 240 more strongly. This increases the current $I_{NFET2}$ back toward the equilibrium $I_{EQUI}$. Similarly, an increase in the current $I_{NFET2}$ from the equilibrium $I_{EQUI}$ results in a decrease in the compensation voltage $V_{COMP}$ and a corresponding decrease in the current $I_{NFET2}$ back toward the equilibrium $I_{EQUI}$.

The compensation circuit 270 is preferably operated with $V_{REF}$ equal to ½ ($V_{DD}-V_{SS}$) which can be accomplished, for example, by selecting $V_{SS}$ equal to 0 Volts and selecting $R_{282}=R_{284}$. When $V_{SS}$ equals 0 Volts and $V_{REF}$ equals ½ $V_{DD}$, the magnitude of a maximum voltage differential between the pads 234, 236 is ½ $V_{DD}$. This maximum voltage differential occurs both when the pad 236 is at 0 Volts, and also when the pad 236 at $V_{DD}$. These properties typically increase the dynamic range of the operational amplifier 250, which is defined as the voltage difference between a maximum and minimum voltage possible for the compensation voltage $V_{COMP}$ supplied by the operational amplifier 250. These properties also improve the common mode rejection ratio of the operational amplifier 250. Consequently, even simple operational amplifier designs can be included in the compensation circuit 270 without significant reduction in performance.

The compensation voltage $V_{COMP}$ supplied by the compensation circuit 270 automatically maintains the equilibrium level of current $I_{EQUI}$ in the second NFET 240. This also maintains the drain voltage at an equilibrium level according to Ohm's Law. This compensation voltage is beneficially used in this embodiment of the present invention to compensate the VCPS 260, which is described next.

The VCPS 260 comprises a third NFET 260 having a gate 262, a source 264, and a drain 266. The gate 262 is coupled to the output 258 of the operational amplifier 250 for receiving the compensation voltage $V_{COMP}$, and the source 264 is coupled to the electrical ground at $V_{SS}$. Thus, the gates 242, 262 of the second and third NFETs 240, 260 are coupled together, and similarly the sources 244, 264 of these two NFETs 240, 260 are coupled together. Moreover, both the second and third NFETs 240, 260 are fabricated on the same IC Chip 140, and are of similar designs.

The drain 266 of the third NFET 260 is coupled to the source 224 of the NFET 220. This drain 266 supplies power to the NFET 220, which allows the NFET 220 to assert output signals to the pad 230. This power is supplied by drawing current $I_{OUT}$ from the source 224 of the NFET 200.

An effective resistance $R_{OUT*}$ between the drain 266 of the third NFET 260 and the high voltage $V_{DD}$ is not constant, unlike in resistance $R_{286}$ of the resistor 286. In particular, $R_{OUT*}$ is extremely high when the NFET 220 is turned OFF. Consequently, the amplitude of the current $I_{VPCS}$ in the third NFET 260 is approximately zero when the NFET 220 is turned OFF. When the NFET 220 is turned from OFF to ON the resistance $R_{OUT*}$ initially drops significantly. The current $I_{OUT}$ increases to draw current from the pad 230, which reduces the magnitude of the voltage $V_{OUT}$ on the pad 230, as desired.

However, as the voltage $V_{OUT}$ on the pad 230 drops, the effective resistance $R_{OUT*}$ increases sharply, and the current $I_{OUT}$ decreases. The effective resistance $R_{OUT*}$ increases because the capacitance of the pad 230, and input gates of circuitry off the IC Chip that are coupled to the pad 230, are drawn down by the current $I_{OUT}$. Once this capacitance is drained, the NFET 220 cannot draw further current $I_{OUT}$ from the pad 230.

The similarities in electrical connections, fabrication, and design between the second and third NFETs 240, 260 allow the electrical characteristics of the second NFET 240 to model those of the third NFET 260. The optimal degree of compensation for maintaining the equilibrium current $I_{EQUI}$ in the second NFET 240 is directly related to the optimal degree of compensation for stabilizing the maximum amplitude of current $I_{OUT}$ in the third NFET. The third NFET 260 receives this compensation from the compensation voltage.

Because the resistance $R_{OUT*}$ varies, the current $I_{OUT}$ is not maintained at an equilibrium amplitude. However, variations in the maximum current $I_{OUT}$ are stabilized by the compensation provided by the present invention. For example, as the temperature of the IC Chip 140 increase, the maximum amplitude of current $I_{OUT}$ remains substantially unchanged. This in turn stabilizes the slew-rate to the improved output buffer 200.

Figure 3:
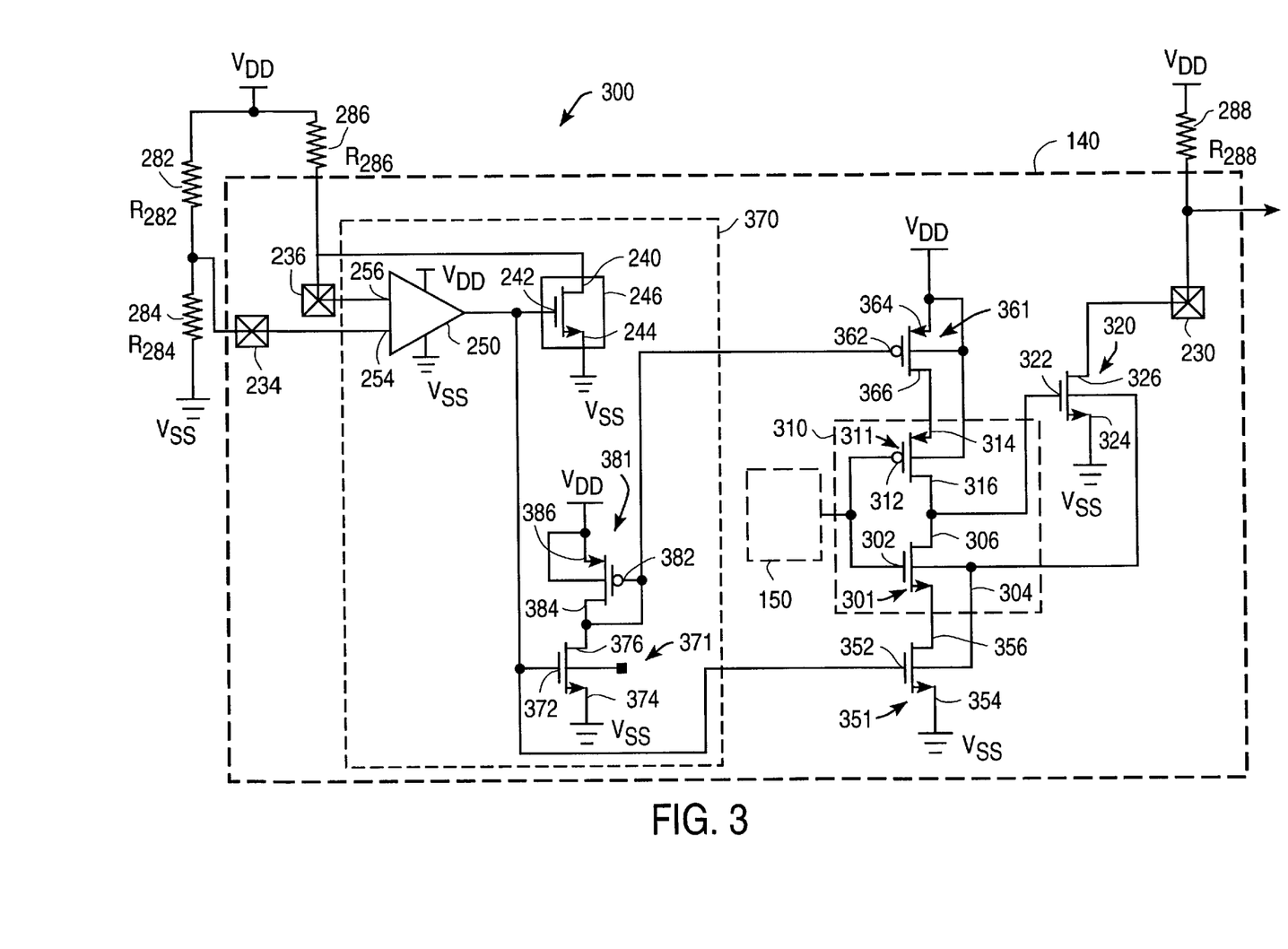
FIG. 3 is a block diagram of a second and preferred embodiment of an output buffer of the present invention that includes two compensations voltages for driving two compensating transistors of a VCPS.

Referring now to FIG. 3, there is shown a block diagram of a second and preferred embodiment of an improved output buffer 300 of the present invention. The improved output buffer 300 comprises a compensation circuit 370, a voltage controlled power source (VCPS) 360, a pre-driver 310, a first NFET 320, and pads 230, 234, 236. These component elements are fabricated on an IC Chip 140. The improved output buffer 300 further comprises resistors 282, 284, 286, 288 located off board the IC Chip 140. A voltage source at $V_{DD}$ and an electrical ground at $V_{SS}$ are included on the IC Chip 140 for powering circuitry thereon.

In improved output buffer 300, the core 150 of the IC Chip asserts a control signal to the pre-driver 310. In response thereto, the pre-driver 310 asserts a buffered control signals to the first NFET 320. The buffered control signal turns ON the first NFET 320 to assert a LOW output signal at $V_{SS}$ to the pad 230. The buffered control signal can also turn OFF the first NFET 320. When the first NFET 320 is turned OFF, the resistor 288 asserts a HIGH signal to the pad 230 by pulling up the voltage on the pad 320 to $V_{DD}$.

The compensation circuit 370 asserts first and second compensation voltages $V_{COMP1}$, $V_{COMP2}$. These compensation voltages are asserted to inputs of the VCPS. In response thereto, the VCPS supplies a variable quantity of power to the pre-driver 310. This controls the signal strength of the buffered control signal. Thus, this embodiment of the present invention compensates the pre-driver 310, which in turn compensates the first NFET 320. The pre-driver 210 of improved output buffer 210 is thus eliminated. These various features of the present invention are next addressed in greater detail.

In improved output buffer 300, the resistors 282, 284, 286 assert a reference voltage $V_{REF}$ and a control voltage $V_{COMP}$ to the pads 234, 236 in the manner described with respect to improved output buffer 200. These resistors 282, 284, 286 are preferably fabricated off the IC Chip 140 to provide the benefits described above with respect to the improved output buffer 200.

The compensation circuit 370 comprises an operational amplifier 250, a second NFET 240, a third NFET 371, and an effective resistance 381. The operational amplifier 250 and the second NFET 240 are coupled with each other and to the pads 234, 236, as in the compensation circuit 270 of FIG. 2. The operational amplifier 250 thus supplies a compensation voltage as in compensation circuit 270. This compensation voltage is referenced as $V_{COMP1}$ in FIG. 3. The third NFET 371 and effective resistance 381 generate the second compensation voltage $V_{COMP2}$ in response to the first $V_{COMP1}$.

The third NFET 371 has a gate 372, source 374 and drain 376. The gate 372 is coupled to the output of the operational amplifier 250, and hence receives the first compensation voltage $V_{COMP1}$. The source 384 is coupled to the electrical ground at $V_{SS}$. The drain 376 is coupled to one end 384 of an effective resistance 381. An opposite end 386 of the effective resistance 381 is coupled to the high voltage source at $V_{DD}$.

In compensation circuit 370, the effective resistance 381 comprises a PFET 381 having a gate 382, source 384, and drain 386. The gate 382 is coupled to the source 384. This allows the PFET 381 to operate much like a diode. In particular, the PFET 381 allows current to flow from the high voltage source at $V_{DD}$ to the third NFET 371 when the third NFET 371 is turned ON. The voltage drop across this diode then acts as the effect resistance 381. It is also in accordance with the present invention to fabricate the effective resistance 381 as a length of doped polysilicon or other material. However, using the PFET 381 in the manner described provides a more precise voltage drop between the third NFET 371 and the high voltage source at $V_{DD}$.

The third NFET 371 and effective resistance 381 invert the first compensation voltage $V_{COMP1}$ to assert the second compensation voltage VCOMP2 at the drain of the third NFET 371. In particular, increasing the first compensation voltage $V_{COMP1}$ turns ON the third NFET 371 more strongly. This draws down the voltage at the drain 376 of the third NFET 371. Similarly, decreasing the first compensation voltage $V_{COMP1}$, turns ON the third NFET 371 less strongly. This allows the effective resistance 381 to pull up the voltage at the drain 376 of the third NFET 371 toward $V_{DD}$. Thus, the second compensation voltage $V_{COMP2}$ asserted at the drain 376 of the third NFET 371 is an inverted form of the first compensation voltage $V_{COMP1}$. The first and second compensation voltages are typically asserted over a range of values between $V_{SS}$ and $V_{DD}$, and are not restricted to being either a HIGH signal or a LOW signal. These compensation voltages control the quantity of power delivered by the VCPS 360 to the pre-driver 310.

The pre-driver 310 and VCPS 360 are structured as follows. The pre-driver 310 comprises a second PFET 311 having a gate 312, source 314 and drain 316, and further comprises a fourth NFET 301 having a gate 302, source 304 and drain 306. The gates 312, 302 are coupled together to form an input of the pre-driver 310. This input is coupled to the core 150 of the IC Chip, and receives the control signal therefrom. The drains 316, 306 are coupled together to form an output of the pre-driver 310. This output supplies the buffered control signal to the gate 322 of the first NFET 320.

The FETs 311, 301 form an inverter. The inverter buffers the control signal from the core 150 of the IC Chip 140. However, unlike a conventional inverter, the sources 314, 304 of the second PFET 311 and the fourth NFET 301 are not coupled directly to the high voltage supply at $V_{DD}$, nor to the ground voltage supply at $V_{SS}$. Rather, the sources 314, 304 of these two FETs 311, 301 are coupled to the VCPS 360, and receive power therefrom.

The VCPS 360 comprises a third PFET 361 and a fifth NFET 351. The third PFET 361 has a gate 362, source 364 and drain 366. The gate 362 is coupled to the drain 376 of the third NFET 371. The gate 362 thus receives the second compensation voltage $V_{COMP2}$ from the compensation circuit 370. The source 364 is coupled to the high voltage source at $V_{DD}$, and receives power therefrom. The drain 366 is coupled to the source 314 of the second PFET 311 in the pre-driver 310, and provides a variable quantity of power thereto.

The fifth NFET 351 has a gate 352, source 354 and drain 356. The gate 352 is coupled to the output of the operational amplifier 250. The gate 352 thus receives the first compensation voltage $V_{COMP1}$ from the compensation circuit 370. The source 354 is coupled to the ground voltage source at $V_{SS}$, and receives power therefrom. The drain 356 is coupled to the source 304 of the fourth NFET 311 in the pre-driver 310, and provides a variable quantity of power thereto.

The first compensation voltage $V_{COMP1}$ compensates the fifth NFET 351 in the VCSP 360 by controlling the amplitude of current that flow from the drain 356 to the source 354. As in the improved output buffer 200, this current flows essentially only when the fourth NFET 301 is turned ON, including when the fourth NFET 301 is switching from ON to OFF, and vice versa. The fourth and fifth NFET 301, 351 operate like the first and third NFETs 220, 260 in FIG. 2.

However, in the improved output buffer 300, the drain of the fourth NFET 306 is coupled to the gate 322 of the first NFET 320, and not directly to the pad 230. The fourth NFET 301 thus does not directly assert output signals. Rather, the fourth NFET 301 asserts a buffered control signal that reflects the optimal level of compensation for the IC Chip. This buffered control signal is applied to the gate 322 of the NFET 320, as opposed to the source 324. Thus, in improved output buffer 300, the transistor 320 that asserts output signals to the pad 230 is compensated at the gate 322; whereas in improved output buffer 200, the transistor 220 that asserts output signals to the pad 230 is compensated at the source 224.

The second and third PFETs 311, 361 operate much like the fourth and fifth NFETs 301, 351. In particular, the second compensation voltage $V_{COMP2}$ compensates the third PFET 361 in the VCSP 360 by controlling the amplitude of current that flows from the source 364 to the drain 366. As in the improved output buffer 200, this current flows essentially only when the second PFET 311 is turned ON, including when the second PFET 311 is switching from ON to OFF, and vice versa.

Figure 4:
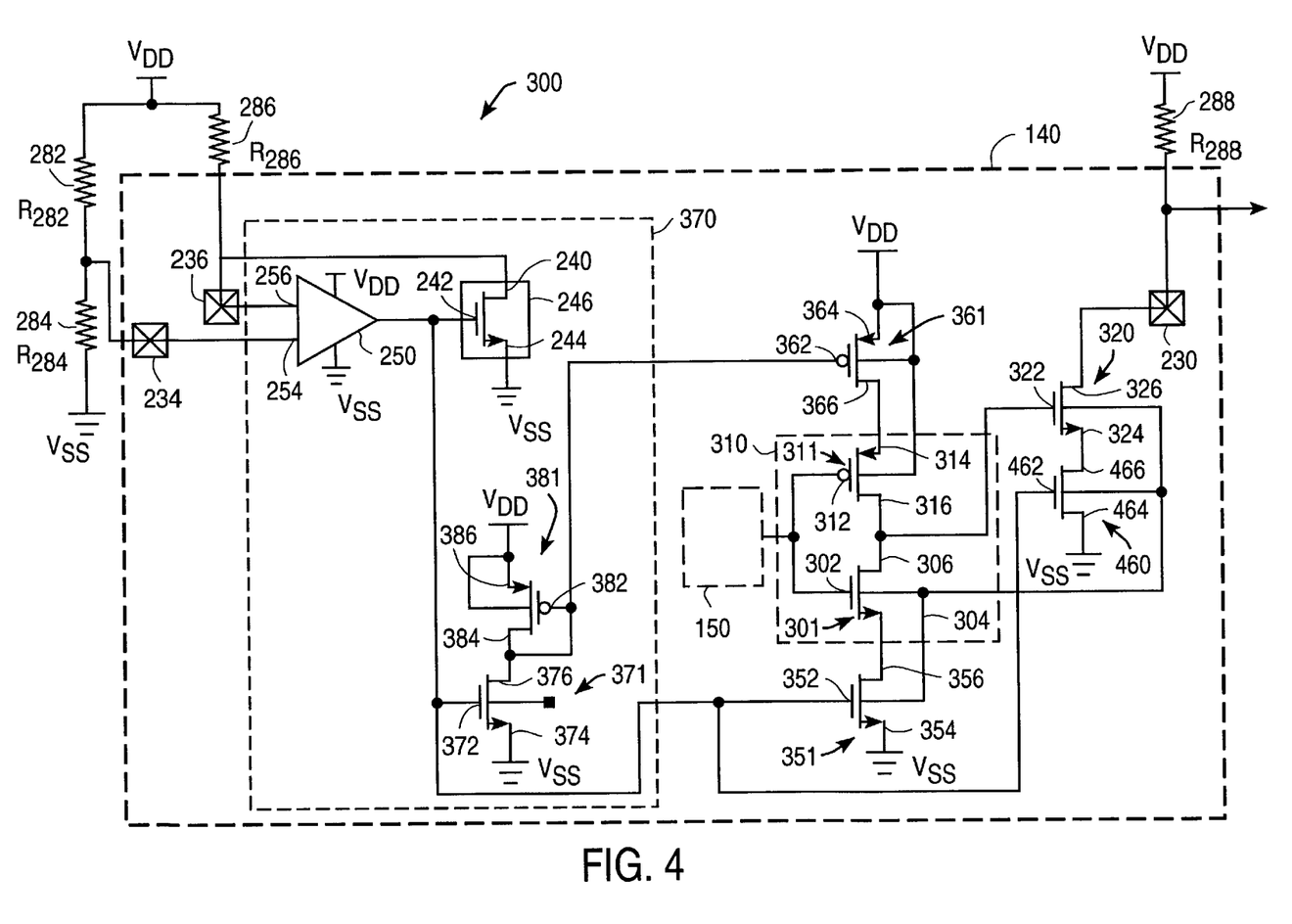
FIG. 4 is a block diagram of an alternative and third embodiment of an output buffer of the present invention that includes two compensations voltages for driving two compensating transistors of a VCPS, and that compensates both the gate and the source of a transistor.

Referring now also to FIG. 4 there is shown a block diagram of a fourth and preferred embodiment of an improved output buffer 400 of the present invention that supplies compensation to both the gate 322 and the source 324 of a transistor 320. The improved output buffer 400 comprises all of the component elements of the improved output buffer 300. The improved output buffer 400 further comprises a sixth NFET 460 not included in the improved output buffer 300.

The sixth NFET 460 has a gate 462, source 464, and drain 466. The gate 462 is coupled to output of the operational amplifier 250. This gate 462 thus receives the first compensation voltage $V_{COMP1}$ from the compensation circuit 370. The source 464 is coupled to the electrical ground at $V_{SS}$, and receives power therefrom. The drain 466 of the sixth NFET 460 is coupled to the source 324 of the first NFET 320. The sixth NFET 460 supplies a variable quantity of power to the first NFET 320. This variable quantity of power is supplied by controlling the amplitude of current drawn from the source 324 of the first NFET 320 when the first NFET 320 is turned ON.

By compensating both the source 324 and the gate 322 of the first NFET 320, the slew-rate of the improved output buffer 400 can be controlled over even narrower tolerances than are provided by the improved output buffers 200, 300. However, the sixth NFET 460 typically is relatively larger than the PFETs 361, 311, and the NFETs 301, 351 in the pre-driver 310 and VCPS 360. Consequently, the additional improvement in slew-rate tolerance over improved output buffers 200, 300 requires additional space on the IC Chip 140 to implement, and hence can be more costly to implement than improved output buffers 200, 300.

Various alternative embodiments of the present invention are also possible. For example, the improved output buffers 300, 400 can alternatively be implemented to assert HIGH signals to the pad 230, with the resistor 288 being coupled to $V_{SS}$ instead of $V_{DD}$ and acting as a passive pull-down device. This is preferably implemented by replacing the NFET 320 with a fourth PFET. In improved output buffer 300, the source of this fourth PFET would preferably be coupled to $V_{DD}$, and in improved output buffer 400 the source of this fourth PFET would preferably be coupled to the drain of a fifth PFET which replaces the NFET 460. This fifth PFET would be powered by $V_{DD}$ instead of $V_{SS}$. Similarly, the improved output buffers 200, 300, 400 can be modified to assert tri-state output to the pad 230 by including compensated pull-up and pull-down transistors which assert signals to the pad 230, and in improved output buffers 300, 400 by further omitting the resistor 288.

Figure 5:
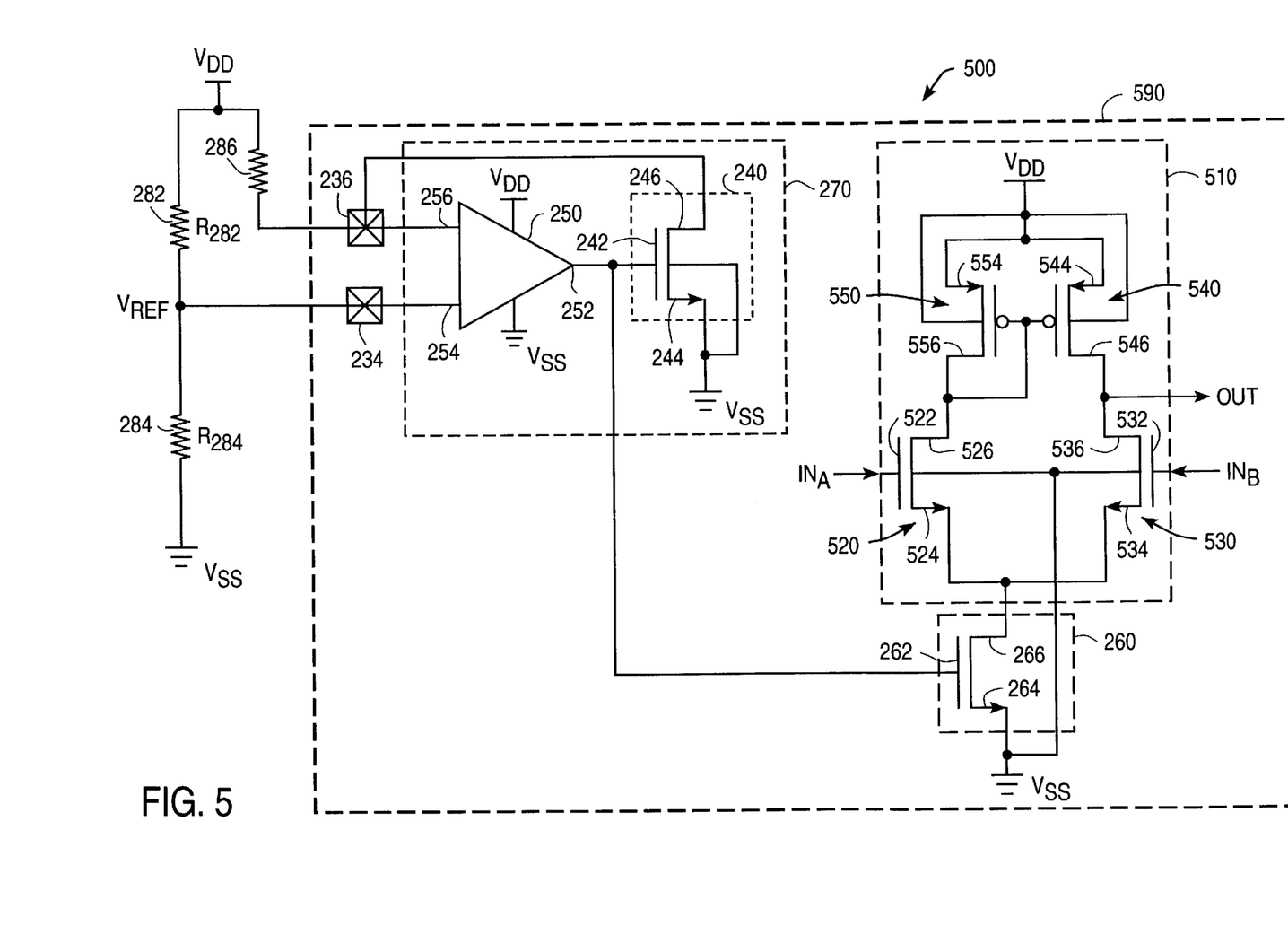
FIG. 5 is a block diagram of an alternative and fourth embodiment of a differential amplifier of the present invention that uses a compensation voltage to drive a VCPS which supplies power for the differential amplifier.

The compensation circuit 270 of the present invention can also be used for compensating other types of circuitry encountered on IC Chips. Referring now to FIG. 5, there is shown a block diagram of a compensated differential amplifier 500 of the present invention which is fabricated in part on an IC Chip 590 that includes a voltage source at $V_{DD}$ and an electrical ground at $V_{SS}$. The compensated differential amplifier 500 comprises resistors 282, 284, 286, pads 234, 236, compensation circuit 270, and VCPS 260 fabricated and coupled as illustrated in FIG. 2. The compensated differential amplifier further comprises a amplifying module 510 that receives input signals $IN_A$, $IN_B$ at voltage levels $V_A$, $V_B$ respectively, and supplies an output signal OUT that amplifies the voltage differential ($V_A$–$V_B$) between these input signals $IN_A$, $IN_B$.

The amplifying module 510 comprises NFETs 520, 530 having gates 522, 532, sources 524, 534, and drains 526, 536 respectively, and further comprises PFETs 540, 550 having gates 542, 552, sources 544, 554, and drains 546, 556 respectively. The sources 544, 554 of the PFETs 540, 560 are coupled to the voltage source at $V_{DD}$, the drains 546, 556 of the PFETs 540, 560 are coupled respectively to the drains 526, 536 of the NFETs 520, 530, and the sources 524, 534 of the NFETs 520, 530 are both coupled to drain 266 of NFET 260 comprising the VCPS 260 in this embodiment of the present invention.

As those skilled in the art will recognize, the amplifying module 510 will operate as a differential amplifier if current is drawn from the sources 524, 534 of the NFETs 520, 530 at a substantially constant rate. In compensated differential amplifier 500, the VCPS 260 draws such current from these sources 524, 534 at a highly constant rate irrespective of process and operating condition variations encountered on the IC Chip 590. The compensated differential amplifying 500 thus operates as a differential amplifier that is essentially immune to such variations, and thus has very narrow slew-rate tolerances compared to conventional differential amplifier designs.

While the present invention has been described with reference to several preferred and alternative embodiments thereof, those skilled in the art will recognize that various modifications can be provided. For example, voltage sources and electrical grounds can be supplied either on an IC Chip itself or from circuitry off such IC Chip. Further, compensation circuits and methods of the present invention can beneficially be used to compensate various types of circuitry on an IC Chip. Such modifications are provided for by the present invention which is limited only by the following claims.

What is claimed is:

1. A circuit for compensating an integrated circuit chip to account for variations in process and operating conditions, the circuit comprising:
   a resistor having a first end coupled to a first voltage, and having a second end for supplying a control voltage;
   a transistor having a first port coupled to the second end of the resistor, a second port coupled to a second voltage, and a third port for controlling the amplitude of a current flowing between the first and second ports;
   an operational amplifier having a first input coupled to the second end of the resistor for receiving the control voltage, a second input coupled to a reference voltage between the first and second voltages, and an output coupled to the third port of the transistor for providing a compensation voltage thereto, with the compensation voltage maintaining said current in the transistor at a substantially constant amplitude;
   a second transistor having a fourth port coupled to the output of the operational amplifier for receiving the compensation voltage, a fifth port coupled to the second voltage, and a sixth port for supplying a flow of current at an amplitude responsive to the compensation voltage; and
   circuitry having an effective resistance, the circuitry providing a third end and a fourth end, the third end coupled to the sixth port of the second transistor for receiving the flow of current, the fourth end coupled to the first voltage for supplying said flow of current thereto, with the voltage drop across the circuitry providing a second compensation voltage at the third end of the circuitry.

2. The circuit of claim 1, further comprising a second circuit fabricated using the same process as the transistor, the second circuit having a third input coupled to the output of the operational amplifier for receiving the compensation voltage, with the compensation voltage stabilizing electrical characteristics of the second circuit over a broad range of operating temperatures of the second circuit.

3. The circuit of claim 2, wherein the transistor and the second circuit are fabricated on a single integrated circuit chip.

4. The circuit of claim 1, wherein the transistor is fabricated on an integrated circuit chip, and wherein the resistor is fabricated off said integrated circuit chip.

5. The circuit of claim 1, wherein the transistor is fabricated on an integrated circuit chip, and wherein the resistor is fabricated off said integrated circuit chip at a level of resistance that compensates for process variations in the integrated circuit chip.

6. The circuit of claim 1, further comprising a voltage divider having a fourth port coupled to the first voltage, a fifth port coupled to the second voltage, and a sixth port for supplying the reference voltage at a substantially fixed voltage level.

7. The circuit of claim 6, wherein the transistor is fabricated on an integrated circuit chip, and wherein the voltage divider further comprises a pair of series connected resistors fabricated off said integrated circuit chip, for providing resistance in said resistors that are independent of temperature and process variations on the integrated circuit chip.

8. The circuit of claim 1, wherein the transistor comprises a field effect transistor having a drain, a source, and a gate, and wherein the drain comprises the first port, the source comprises the second port, and the gate comprises the third port.

9. The circuit of claim 1, further comprising a buffer having a third input for receiving a first signal, a fourth input coupled to the output of the operational amplifier for receiving the compensation voltage, and an output for supplying a second signal in response to the first signal, with the compensation voltage stabilizing the slew-rate of the buffer.

10. The circuit of claim 1, further comprising a voltage controlled power supply having an third input coupled to the output of the operational amplifier for receiving the compensation voltage, and having an output coupled to supply power at a rate responsive to the magnitude of the compensation voltage.

11. The circuit of claim 10, wherein the transistor comprises a first field effect transistor, the voltage controlled power supply comprises a second field effect transistor, and both field effect transistors are fabricated on a single integrated circuit chip to allow the first field effect transistor to model electrical characteristics of the second field effect transistor.

12. The circuit of claim 10, wherein the transistor comprises a first field effect transistor, the voltage controlled power supply comprises a second field effect transistor, and both field effect transistors are of similar design to allow the first field effect transistor to model electrical characteristics of the second field effect transistor.

13. The circuit of claim 1, wherein the first voltage is higher than the second voltage, and wherein the flow of current comprises a second current flowing from the circuitry into the second transistor.

14. The circuit of claim 1, wherein the first voltage is higher than the second voltage, and wherein the flow of current comprises a second current flowing to the second transistor from the circuitry.

15. The circuit of claim 1, further comprising:
   a first voltage controlled power supply having an third input coupled to the output of the operational amplifier for receiving the compensation voltage, and having an second output coupled to supply power at a rate responsive to the compensation voltage; and
   a second voltage controlled power supply having an fourth input coupled to the third end of the circuitry for receiving the second compensation voltage, and having an third output coupled to supply power at a rate responsive to the second compensation voltage.

16. The circuit of claim 1, further comprising an amplifier having a third input for receiving a first signal, fourth input coupled to the output of the operational amplifier for receiving the compensation voltage, and an output for supplying a second signal in response to the first signal, with the compensation voltage compensating the amplifier for any variations in process and operating conditions.

* * * * *